United States Patent
Kim et al.

(10) Patent No.: US 8,228,746 B2
(45) Date of Patent: Jul. 24, 2012

(54) SEMICONDUCTOR MEMORY APPARATUS

(75) Inventors: Dae Suk Kim, Ichon-si (KR); Seoung Hyun Kang, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 197 days.

(21) Appl. No.: 12/650,380

(22) Filed: Dec. 30, 2009

(65) Prior Publication Data

US 2011/0128800 A1    Jun. 2, 2011

(30) Foreign Application Priority Data

Nov. 30, 2009   (KR) .................. 10-2009-0117243

(51) Int. Cl.
*G11C 7/00*    (2006.01)
(52) U.S. Cl. ............... 365/191; 365/230.06; 365/230.08
(58) Field of Classification Search .................. 365/191, 365/198, 189.05, 230.03, 230.06, 230.08
See application file for complete search history.

(56) References Cited

U.S. PATENT DOCUMENTS

| | | | |
|---|---|---|---|
| 3,942,162 A * | 3/1976 | Buchanan ..................... 365/203 |
| 3,976,892 A * | 8/1976 | Buchanan ..................... 326/97 |
| 5,243,574 A * | 9/1993 | Ikeda ........................... 365/207 |
| 5,553,025 A | 9/1996 | Haraguchi |
| 5,774,472 A * | 6/1998 | Matsuoka ..................... 714/718 |
| 5,838,632 A * | 11/1998 | Joo ............................... 365/239 |
| 5,864,510 A | 1/1999 | Nakaoka |
| 5,886,934 A * | 3/1999 | Nagaoka et al. ......... 365/189.11 |
| 6,144,278 A * | 11/2000 | Nishida et al. ................. 336/92 |
| 6,320,794 B1 * | 11/2001 | Kang et al. ............... 365/189.02 |
| 6,546,512 B1 | 4/2003 | Ochoa et al. |
| 6,842,033 B1 | 1/2005 | Kim et al. |
| 2003/0188238 A1 | 10/2003 | Partsch et al. |
| 2005/0213397 A1 | 9/2005 | Santin |
| 2006/0123291 A1 | 6/2006 | Kim |

FOREIGN PATENT DOCUMENTS

| | | |
|---|---|---|
| JP | 01-173499 | 7/1989 |
| JP | 2004-045090 | 2/2004 |
| KR | 10-20040084157 A | 10/2004 |

* cited by examiner

*Primary Examiner* — Gene Auduong
(74) *Attorney, Agent, or Firm* — William Park & Associates Ltd.

(57) ABSTRACT

A semiconductor memory apparatus is provided. The semiconductor memory apparatus includes: an address pad; an address pad buffer section configured to selectively receive a signal of the address pad; a data input buffer section configured to selectively receive the signal of the address pad; and a signal control section configured to selectively provide a path of the signal of the address pad to the address buffer section and the data input buffer section.

14 Claims, 4 Drawing Sheets

US 8,228,746 B2

SEMICONDUCTOR MEMORY APPARATUS

CROSS-REFERENCE TO RELATED APPLICATION

The present application claims priority under 35 U.S.C. §119(a) to Korean Application No. 10-2009-0117243, filed on Nov. 30, 2009, in the Korean Intellectual Property Office, which is incorporated herein by reference in its entirety as if set forth in full.

BACKGROUND OF THE INVENTION

1. Technical Field

Various embodiments of the present disclosure generally relate to a semiconductor memory apparatus, and more particularly, to a semiconductor memory apparatus which selectively uses pads.

2. Related Art

In general, expensive test equipment is used to perform a reliability test for a semiconductor memory apparatus. The test is very time-consuming. A high-integration trend of semiconductor memory apparatuses increases a time and cost required for such a test. Therefore, when such a semiconductor integrated circuit test is performed, a plurality of semiconductor integrated circuits is tested simultaneously in parallel to reduce the test time. In this case, input and output pins of a tester are allocated depending on a configuration of the tested semiconductor integrated circuits. However, the limited number of input and output pins of the tester may limit the number of semiconductor integrated circuits which may be tested in parallel. Accordingly, the number of semiconductor integrated circuits to be tested simultaneously may be limited. Also, a semiconductor integrated circuit may be provided with multiple input and output pins. Accordingly, the number of semiconductor integrated circuits to be tested simultaneously is inevitably further limited. Then, since the efficiency of the simultaneous test is reduced by the limited resource of the tester, the test time may increase.

SUMMARY OF THE INVENTION

Various aspects of the present invention comprise a semiconductor memory apparatus capable of selectively controlling pads.

In one aspect of the present invention, a semiconductor memory apparatus comprises: an address pad; an address pad buffer section configured to selectively receive a signal of the address pad; a data input buffer section configured to selectively receive the signal of the address pad; and a signal control section configured to selectively provide a path of the signal of the address pad to the address buffer section and the data input buffer section.

In another aspect of the present invention, a semiconductor memory apparatus comprises: an address pad; a data input and output (I/O) pad; a data input buffer section configured to selectively receive a signal of the address pad and the data I/O pad; and a signal control section configured to control the signal of the address pad to be selectively provided to the data input buffer section.

In another aspect of the present invention, a semiconductor memory apparatus comprises: an address pad configured to selectively receive an address signal and first input data; a data I/O pad configured to receive second input data; an address buffer section configured to receive the address signal of the address pad; a data input buffer section configured to receive the first and second input data from the address pad and the data I/O pad; and a signal control section configured to selectively provide a signal path of the address path to the address buffer section and the data input buffer section.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
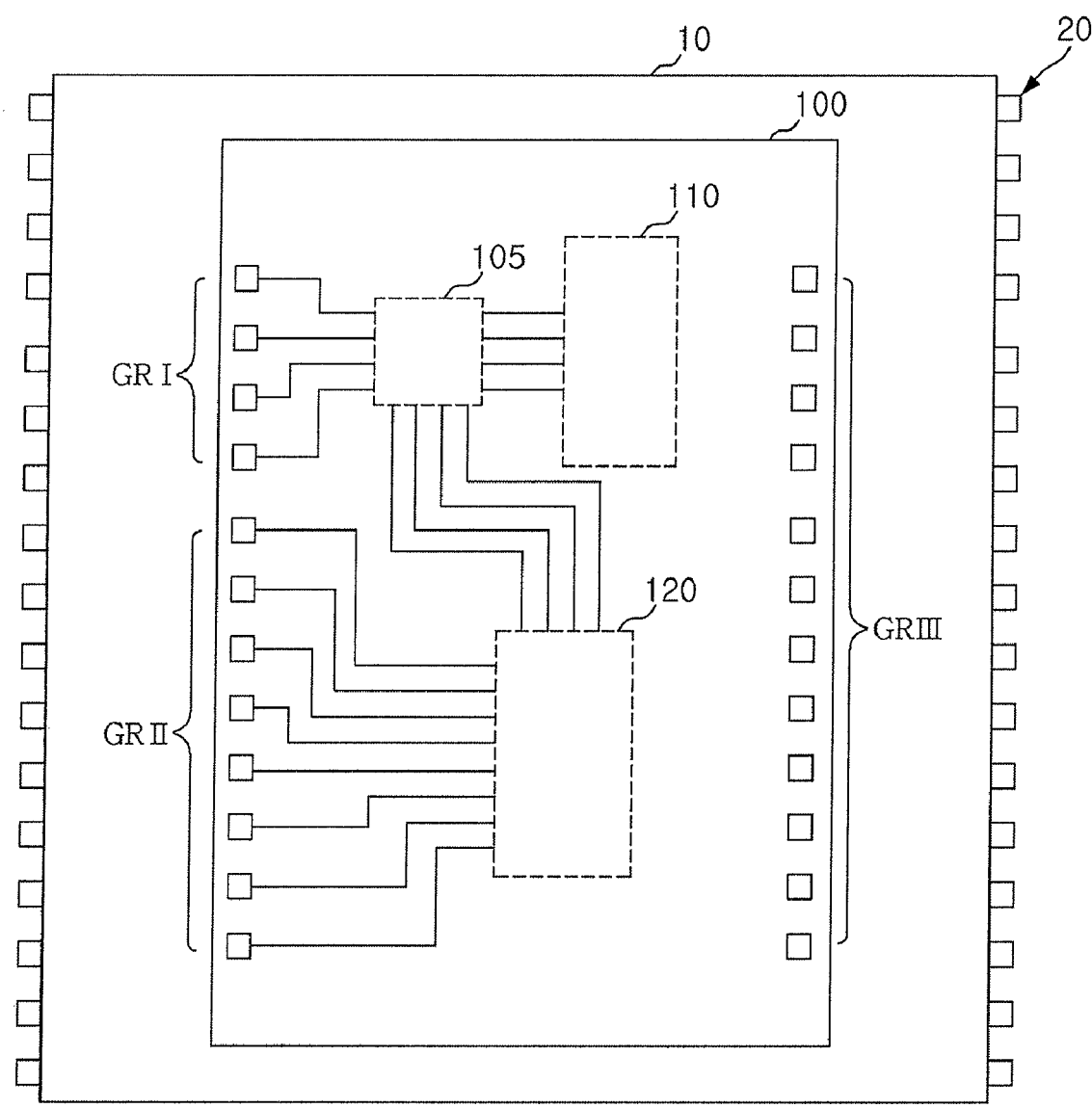
FIG. 1 is a top view of a semiconductor memory apparatus according to one embodiment of the invention.

Advantages and characteristics of the present invention and a method for achieving them will be apparent with reference to embodiments described below in addition with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

FIG. 1 is a top view of a semiconductor memory device according to one embodiment of the invention. Referring to FIG. 1, the semiconductor memory apparatus comprises a circuit board 10, a plurality of external connection terminals 20, and a chip 100. The chip 100 may be mounted on the circuit board 10 and the external connection terminals 20 may be provided so as to be arranged at both sides of the chip 100. The circuit board 10 may be a printed circuit board (PCB) having a metal pattern formed thereon.

Each of the external connection terminals 20 is formed of a metallic material to which a signal may be applied from an external source and may be a pin, needle, or soldering ball which may be probed with an external signal application terminal. In the case of the soldering ball, it may be disposed on the lower surface of the circuit board 10. The external connection terminal 20 may be of any configuration capable of receiving a signal from an external source.

The chip 100 comprises a circuit unit and a plurality of chip pads. The circuit unit comprises a signal control section 105, an address buffer section 110, and a data input buffer section 120, and the plurality of chip pads comprise address pads GRI, data input and output (I/O) pads GRII, and other clock and command pads GRIII. The chip 100 may be mounted on the circuit board 10 using, for example, a thermal conductive adhesive. The chip pads of the chip 100, that is, the address pads GRI, the data I/O pads GRII, and the clock and command pads GRIII, may be electrically connected to external connection terminals using, for example, bonding wires. The wires may be, for example, a gold-plated material that increases conductivity.

The address pads GRI may be arranged in a line at one side edge of the chip 100 in a longitudinal direction thereof so as to transmit and receive an address signal. Typically, the address pads GRI are connected to the address buffer section 110. According to one embodiment, however, signals of the address pads GRI may be selectively provided to the address buffer section 110 and the data input buffer section 120 by the signal control section 105. In other words, the address pads GRI may receive an address signal or an input data signal. When a column-related command is inputted, an address signal may be applied to the address pads GRI. However, after a preset latency period, input data may be applied to the address pads GRI such that the address pads GRI may be used as the data I/O pads GRII. That is, without being limited to the number of I/O pins of a tester, one pin may be used to selectively receive two types of signals, which makes it possible to increase the efficiency of a parallel test. This is described below in detail with reference to the following drawings.

The data I/O pads GRII may be arranged in a line and on the same line as the address pads GRI so as to transmit and receive a data signal. The data I/O pads GRII may be connected to the data input buffer section 120. For convenience of description, only the data input buffer section 120 is shown. However, the data I/O pads GRII may be connected to a data output buffer section (not shown). That is, data received by the data I/O pads GRII may be provided to the data input buffer section 120 in response to a write command, and data from the data output buffer section (not shown) may be provided to the data I/O pads GRII in response to a read command.

The other clock and command pads GRIII may be arranged at the other side edge of the chip 110 so as to face the address pads GRI and the data I/O pads GRII. The other clock and command pads GRIII may serve to receive clock signals, command signals, and various test mode signals.

Figure 2:
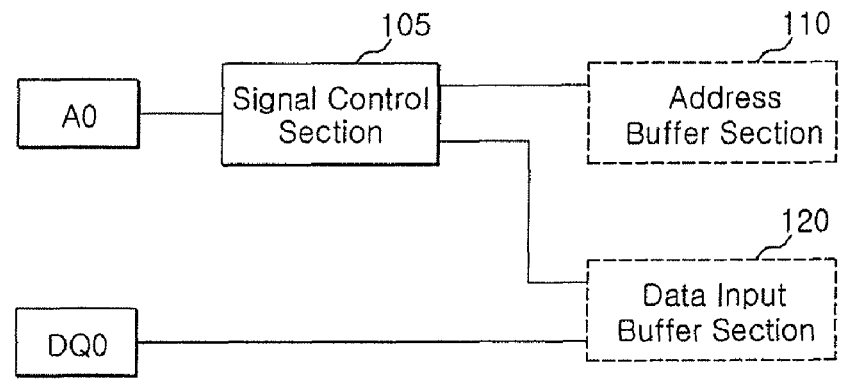
FIG. 2 is a block diagram illustrating a relationship among one address pad, one data input and output (I/O) pad, and a signal control section according to one embodiment of the invention.

FIG. 2 is a block diagram illustrating a relationship among one address pad, one data I/O pad, and the signal control section 105. Referring to FIG. 2, a signal control unit 105 may be connected to a first address pad A0 to selectively provide a signal of the first address pad A0 to an address buffer section 110 and a data input buffer section 120. The address buffer section 110 may receive a signal of the signal control section 105.

The data input buffer section 120 may receive a signal of the first address pad A0 or a signal of the first data I/O pad DQO.

Figure 3:
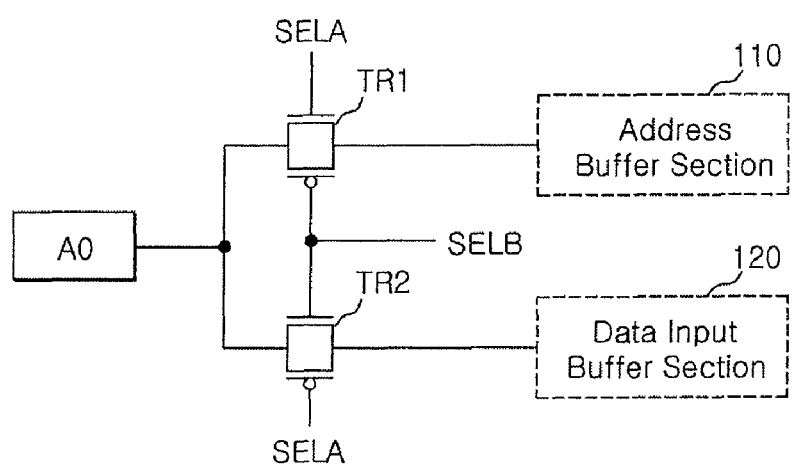
FIG. 3 is a circuit diagram of the signal control unit of FIG. 2.

FIG. 3 is a circuit diagram of the signal control section 105.

The signal control section 105 may receive a signal of the first address pad A0 and determine whether to provide the signal to the address buffer section 110 or the data input buffer section 120 in response to first and second selection signals SELA and SELB. The signal control section 105 may comprise first and second transmission gates TR1 and TR2.

When turned on in response to the first and second selection signals SELA and SELB, the first transmission gate TR1 provides the signal of the first address pad A0 to the address buffer section 110.

When turned on in response to the first and second selection signals SELA and SELB, the second transmission gate TR2 provides the signal of the first address pad A0 to the data input buffer section 120.

For example, when the first selection signal SELA is activated and the second section signal SELB is deactivated, the first transmission gate TR1 is turned on to provide the signal of the first address pad A0 to the address buffer section 110.

On the other hand, when the first selection signal SELA is deactivated and the second section signal SELB is activated, the second transmission gate TR2 is turned on to provide the signal of the first address pad A0 to the data input buffer section 120.

The first and second selection signals SELA and SELB may be provided as inverted signals. Therefore, the first and second selection signals SELA and SELB may be referred to as a positive selection signal (+) and a negative selection signal (−) which is an inverted signal of the positive selection signal, as long as they are a pair of signals capable of selectively turning on the first and second is transmission gates TR1 and TR2.

Figure 4:
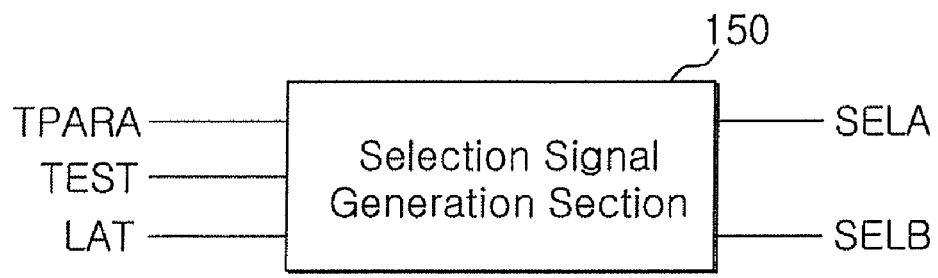
FIG. 4 is a block diagram of a selection signal generation unit according to one embodiment of the invention.
Figure 5:
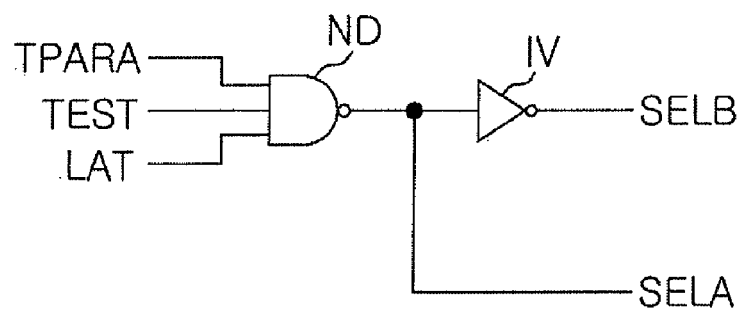
FIG. 5 is a circuit diagram of the selection signal generation unit of FIG. 4.

FIG. 4 is a block diagram of the selection signal generation section 150, and FIG. 5 is a circuit diagram of the selection signal generation section 150. Referring to FIGS. 4 and 5, the selection signal generation section 150 is configured to provide the first and second selection signals SELA and SELB in response to a parallel signal TPARA, a test mode signal TEST, and a latency signal LAT.

The selection signal generation section 150 comprises a NAND gate ND and an inverter IV. The NAND gate ND is configured to NAND-combine the parallel signal TPARA, the test mode signal TEST, and the latency signal LAT to provide the first selection signal SELA.

The inverter IV may be configured to invert the signal of the NAND gate ND to provide the second selection signal SELB.

When a parallel test is to be performed, the selection signal generation section 150 provides an activated parallel signal TPARA and a test mode signal TEST. When a write command is provided, the parallel signal TPARA and the test mode signal TEST are provided as a high level, but the latency signal LAT is not yet activated. Therefore, since the NAND gate receives a low-level latency signal LAT when a write command is provided, the selection signal generation section 150 provides the high-level first selection signal SELA. Furthermore, the second selection signal SELB becomes a low level. Then, the first transmission gate TR1 of the signal control section 105 (shown in FIG. 3) is turned on in response to the first and second selection signals SELA and SELB. In this case, the signal of the first address pad A0 may be provided to the address buffer section 110 (shown in FIG. 3).

Subsequently, a write latency WL required for a write operation is delayed for a predetermined time after the write command WT (shown in FIG. 6) is provided, and then activated. Accordingly, since all the input terminals of the NAND gate receive a high level signal, the first selection signal SELA becomes a low level. The second selection signal SELB becomes a high level which is an inverted level of, the first selection signal SELA. Therefore, the second transmission gate TR2 of the signal control unit 105 is turned on in response to the first and second selection signals SELA and SELB. In this case, the signal of the first address pad A0 may be provided to the data input buffer section 120 (shown in FIG. 3).

At this time, the signal of the first address pad A0 may be a signal of the tenth data I/O pad D9, different from the signal of the first data I/O pad D0. Some of the data I/O pads GRII of the chip 100 (shown in FIG. 1) may use signals passing through the data I/O pads GRII without any modification, and a predetermined number of address pads GRI may be allocated and used like the data I/O pads GRII depending on a state of a tester (not shown). Furthermore, a number of the address pads GRI may be sufficiently utilized for the overall data I/O pads GRII. Therefore, when the address pads GRI are used to receive input data signals, the address pads GRI may be allocated to correspond to the rest data I/O pads. GRII which are not allocated to the tester (not shown).

The parallel signal TPARA and the test mode signal TEST may be provided through a mode resister set (MRS). The parallel signal TPARA and the test mode signal TEST may be combined into one signal meaning a parallel test mode.

Although a write operation has been described above it is to be understood that common uses of the address pads GRI may also performed during a read operation. The reverse process, in which data signals from the data output buffer section (not shown) are selectively provided to the address pads GRI and the data I/O pads GRII, will be understood by those skilled in the art. During the read operation, the latency signal LAT may be applied as column address strobe (CAS) latency.

Figure 6:
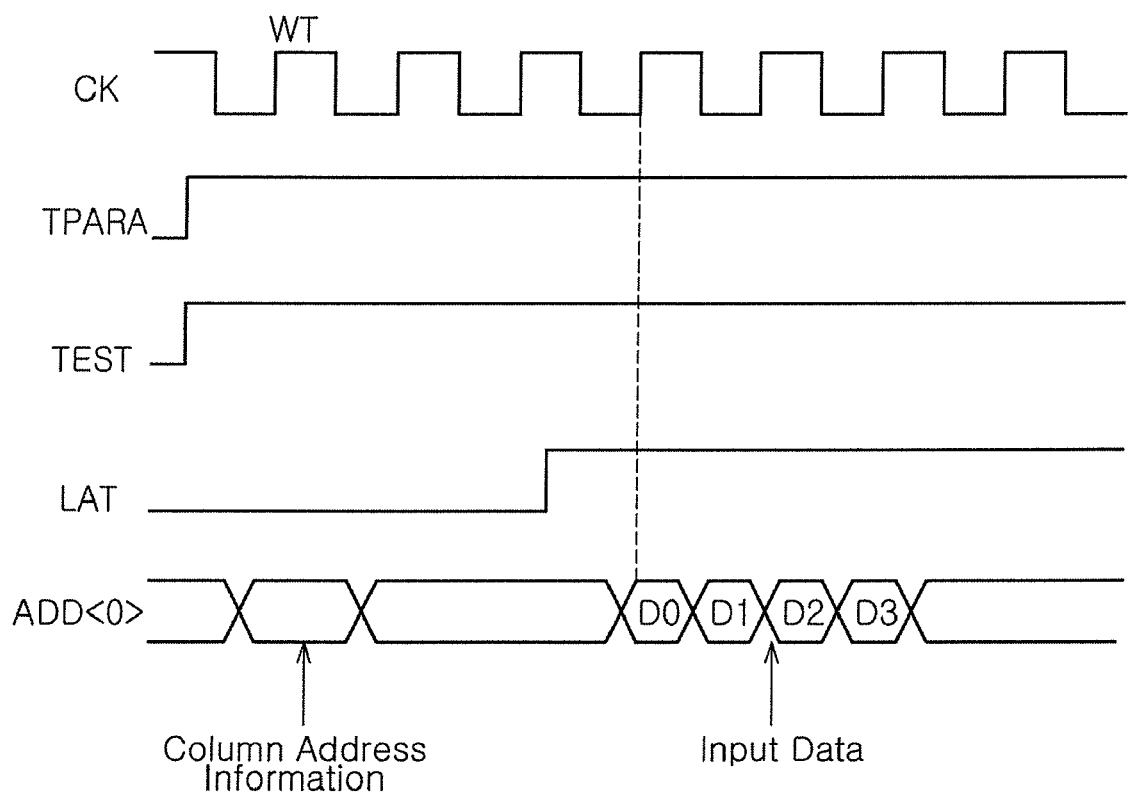
FIG. 6 is a timing diagram illustrating an operation of the semiconductor memory apparatus of FIG. 1.

FIG. 6 is a timing diagram illustrating an operation of the semiconductor memory apparatus according to one embodiment of the invention. Referring to FIGS. 1 through 6, the activated parallel signal TPARA and the activated test mode signal TEST may be provided during a parallel test. Then, a write command WT may be provided. At this time, since the latency signal LAT is deactivated, a path of a signal received by the address pad GRI may be provided to the address buffer section 110. Therefore, in this case, a signal provided by the tester (not shown) may be provided to the address buffer section 110 through the address pad GRI.

After the write command is provided, a preset time is delayed, and the latency signal LAT is activated.

In this case, the path of the signal received by the address pad GRI may be provided to the data input buffer section 120. Accordingly, the signal provided to the address pad GRI by the tester (not shown) is provided to the data input buffer section 120 through the address pad GRI. At this time, the signal received by the address pad GRI becomes input data, not an address signal. Therefore, according to one embodiment, the signal of the address pad GRI may be selectively transmitted to the data input buffer 120.

More specifically, a column address is provided to the address pad GRI at the same time when the write command WT is provided, and the signal of the address pad GRI is transmitted to the address buffer section 110 by the control of the signal control unit 105. After the address input is completed, a new signal may be applied to the address pad GRI.

In other words, after the address input to the address buffer section 110 is completed, the signal of the address pad GRI may no longer be effective (or is no longer used as an address). Therefore, the signal of the address pad GRI may be used for applying a new signal. Therefore, if a different signal is applied to the address pad GRI in response to the latency signal LAT when a predetermined time passes after the address input is completed, that is, the write command WT is provided, a common use of the address pad GRI may be performed. Therefore, the address pad GRI according to the embodiment may be selectively used as the data input pad GRII.

According to the embodiments of the present invention, the address pads may be commonly used because the address input time is different from the data input time. In other words, the address pad may be used as a pad to which an address signal is applied for a predetermined time and may be used as a pad to which input data is applied after the predetermined time.

Therefore, although the number of data I/O pins of a tester is limited, the address pads may be used like the data I/O pads in the semiconductor memory apparatus according to the embodiment. Then, the parallel test may be performed using address pins of the tester connected to the address pads instead of the insufficient data I/O pins of the tester.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
an address pad;
an address pad buffer section configured to selectively receive a signal of the address pad;
a data input buffer section configured to selectively receive the signal of the address pad; and
a signal control section configured to be driven in response to a selection signal generated in response to a parallel signal, a test mode signal and a latency signal in parallel test mode, and selectively provide a path of the signal of the address pad to the address buffer section and the data input buffer section.

2. The semiconductor memory apparatus according to claim 1, further comprising:
a first transmission gate configured to provide the signal of the address pad to the address buffer section in response to the selection signal; and
a second transmission gate configured to provide the signal of the address pad to the data input buffer section in response to the selection signal.

3. The semiconductor memory apparatus according to claim 1, wherein the signal control section is configured to control the signal of the address pad to be provided to the address buffer section when a column-related command is inputted, and control the signal of the address pad to be provided to the data input buffer section after a predetermined time after the column-related command is inputted.

4. The semiconductor memory apparatus according to claim 3, wherein the signal control section is configured to control a first transmission gate be turned on by the selection signal when a column signal is inputted, and control a second transmission gate to be turned on by the selection signal after a predetermined time after the column-related command is inputted.

5. A semiconductor memory apparatus comprising:
an address pad;
a data input and output (I/O) pad;
a data input buffer section configured to selectively receive a signal of the address pad and the data I/O pad; and
a signal control section configured to be driven in response to a selection signal generated by a parallel signal, a test mode signal and a latency signal in parallel test mode, and control the signal of the address pad to be selectively provided to the data input buffer section.

6. The semiconductor memory apparatus according to claim 5, wherein the address pad is configured to receive an address signal when a column-related command is inputted, and receive input data after a predetermined time is delayed after the column-related command is inputted.

7. The semiconductor memory apparatus according to claim 5, wherein the signal control section is configured to selectively provide the signal of the address pad to the data input buffer section in response to the selection signal.

8. The semiconductor memory apparatus according to claim 5, wherein the signal control section is configured to prevent the signal of the address pad from being provided to the data input buffer section when a column-related command is inputted, and provide the signal of the address pad to the data input buffer section after a predetermined time after the column-related command is inputted.

9. The semiconductor memory apparatus according to claim 5, wherein when a predetermined data I/O pin of a tester is allocated to the data I/O pad, a different data I/O pin from the predetermined data I/O pin is allocated to the signal of the address pad in a case where the signal is provided to the data input buffer from the address pad.

10. A semiconductor memory apparatus comprising:
   an address pad configured to selectively receive an address signal and first input data;
   a data I/O pad configured to receive second input data;
   an address buffer section configured to receive the address signal of the address pad;
   a data input buffer section configured to receive the first and second input data from the address pad and the data I/O pad; and
   a signal control section configured to be driven in response to a selection signal generated in response to a parallel signal, a test mode signal and a latency signal in parallel test mode, and selectively provide a signal path of the address path to the address buffer section and the data input buffer section.

11. The semiconductor memory apparatus according to claim 10, wherein the address pad is configured to receive the address signal when a column-related command is inputted to the address pad, and receive the first input data after a predetermined time after the column-related command is inputted.

12. The semiconductor memory apparatus according to claim 10, further comprising:
   a first transmission gate configured to provide the address signal of the address pad to the address buffer section in response to the selection signal; and
   a second transmission gate configured to provide the first input data of the address pad to the data input buffer section in response to the selection signal.

13. The semiconductor memory apparatus according to claim 12, wherein the signal control section is configured to control the signal of the address pad to be provided to the address buffer section when a column-related command is inputted, and control the signal of the address pad to be provided to the data input buffer section after a predetermined time after the column-related command is inputted.

14. The semiconductor memory apparatus according to claim 12, wherein the signal control section is configured to control the first transmission gate to be turned on by the selection signal when a column-related command is inputted, and control the second transmission gate to be turned on by the selection signal after a predetermined time after the column-related command is inputted.

* * * * *